US012723976B2

(12) United States Patent
Xiang et al.

(10) Patent No.: US 12,723,976 B2
(45) Date of Patent: Sep. 1, 2026

(54) ABSORPTION SPECTRUM-BASED CHEMICAL VAPOR DEPOSITION ONLINE IN-SITU CHARACTERIZATION SYSTEM AND METHOD

(71) Applicant: Zhejiang University, Hangzhou (CN)

(72) Inventors: Rong Xiang, Hangzhou (CN); Yicheng Ma, Hangzhou (CN); Lingfeng Wang, Hangzhou (CN); Yige Zheng, Hangzhou (CN); Junhan Zhang, Hangzhou (CN); Huixu Dong, Hangzhou (CN)

(73) Assignee: Zhejiang University, Hangzhou (CN)

( * ) Notice: Subject to any disclaimer, the term of this patent is extended or adjusted under 35 U.S.C. 154(b) by 0 days.

(21) Appl. No.: 19/294,625

(22) Filed: Aug. 8, 2025

(65) Prior Publication Data

US 2025/0362225 A1 Nov. 27, 2025

Related U.S. Application Data

(63) Continuation of application No. PCT/CN2024/106554, filed on Jul. 19, 2024.

(30) Foreign Application Priority Data

Jan. 30, 2024 (CN) ......................... 202410122785.3

(51) Int. Cl.
*G01N 21/31* (2006.01)
*C23C 16/52* (2006.01)
*G01N 21/01* (2006.01)

(52) U.S. Cl.
CPC ......... *G01N 21/3103* (2013.01); *C23C 16/52* (2013.01); *G01N 21/01* (2013.01); *G01N 21/31* (2013.01); *G01N 2201/127* (2013.01)

(58) Field of Classification Search
CPC .. G01N 21/31; G01N 2201/127; G01N 21/01; G01N 21/3103; C23C 16/52
See application file for complete search history.

(56) References Cited

U.S. PATENT DOCUMENTS 5,776,254 A * 7/1998 Yuuki .................. C23C 16/409 118/725
2002/0180991 A1* 12/2002 Takoudis ........... G01N 21/3563 356/630

(Continued)

FOREIGN PATENT DOCUMENTS

CN 104089904 A 10/2014
CN 110068535 A 7/2019

(Continued)

*Primary Examiner* — Michael P LaPage
(74) *Attorney, Agent, or Firm* — IPro, PLLC; Na Xu

(57) ABSTRACT

An absorption spectrum-based chemical vapor deposition (CVD) online in-situ characterization system includes an absorption spectrum detection device, a spectrum movement and optical path calibration device, and a tubular CVD device. By improving the existing tubular CVD device and incorporating the environmental compensation method, the present disclosure achieves accurate detection of the CVD process under high temperature and low pressure conditions, and realizes real-time detection, so the law of changes in the sample or reaction system over time can be determined. Combined with changes in system temperature and pressure, the law of changes in the sample or reaction system with environmental changes can be further acquired, thereby determining the optimal deposition conditions. Through the optical path automatic calibration, the system can detect a deposition state of the sample at any position within the quartz tube during the deposition process, thereby quickly determining the accurate growth window of the sample.

4 Claims, 8 Drawing Sheets

(56) References Cited

U.S. PATENT DOCUMENTS

2005/0082482 A1* 4/2005 Ludviksson ............ C23C 14/54
250/342
2014/0106062 A1* 4/2014 Forrest .................. G01N 21/64
427/9
2015/0284851 A1 10/2015 Du et al.
2017/0314991 A1* 11/2017 Meng ..................... G01N 21/68
2018/0286643 A1* 10/2018 Tuitje ................ H01J 37/32972
2022/0154339 A1 5/2022 Kim et al.
2024/0035960 A1* 2/2024 Dayrell ................ G01N 21/255

FOREIGN PATENT DOCUMENTS

CN 110726682 A 1/2020
CN 110923674 A 3/2020
CN 111349914 A 6/2020
CN 219142659 U 6/2023

* cited by examiner

ABSORPTION SPECTRUM-BASED CHEMICAL VAPOR DEPOSITION ONLINE IN-SITU CHARACTERIZATION SYSTEM AND METHOD

TECHNICAL FIELD

The present disclosure belongs to the technical field of semiconductor production equipment, and relates to an absorption spectrum-based chemical vapor deposition (CVD) online in-situ characterization system and method.

BACKGROUND

Deposition is important technology in semiconductor processing and manufacturing. The equipment involved is collectively referred to as thin-film deposition equipment. Common thin-film deposition processes include physical vapor deposition (PVD) and chemical vapor deposition (CVD). Specifically, CVD refers to a process that reactants interact either with each other or with substrate materials under specific temperature and pressure conditions, so as to generate a target product on a substrate surface. Generally, the reactants of CVD are gaseous substances, while the products are solid materials. For example, in a process of growing carbon nanotubes on a quartz substrate, $CH_4$ gas needs to be introduced as a reactant, and the products are solid carbon nanotubes. Due to advantages such as a simple preparation process, large growth area, and easy transfer, CVD technology has gradually become an important method for atomic-scale manufacturing. Atomic layer deposition (ALD) technology is accordingly derived and developed, and is widely used in the preparation of various material systems such as graphene, carbon nanotubes, and disulfide. CVD equipment, represented by tube furnaces, is one of the core equipment for atomic-scale manufacturing.

Since both CVD and ALD are usually carried out at a given temperature and under vacuum conditions, the existing CVD equipment cannot monitor film deposition in real time during the film deposition process. Instead, deposited samples are usually removed from the CVD equipment upon deposition and then detected by various methods. This method of transferring the samples for detection is collectively referred to as ex-situ characterization. However, for ALD deposition processes involving materials such as grapheme and carbon nanotubes, it is necessary to conduct in-situ monitoring of the film growth to understand structural changes and reaction mechanisms, and to study reaction intermediates and microstructure of the final products. However, the existing CVD equipment, such as tube furnaces, is unable to perform the in-situ monitoring.

Existing in-situ characterization technology is primarily developed for electrochemical research. Most of the reaction devices are equipped with reaction cells that have a relatively small overall area, making them unsuitable for the large-scale CVD equipment used in chemical vapor deposition. In addition, the high-temperature and low-pressure conditions associated with CVD processes will cause errors in the results obtained through the in-situ characterization technology.

SUMMARY

In order to solve the problem that existing chemical vapor deposition (CVD) equipment cannot perform in-situ detection, the present disclosure provides an absorption spectrum-based chemical vapor deposition online in-situ characterization system and method. By designing a system capable of performing in-situ detection of a deposited sample in real time during a vapor deposition process, and considering the influence of deposition parameters on detection results for corresponding compensation, the present disclosure enables online in-situ monitoring of the vapor deposition process, which provides a possibility for studying microstructures of intermediates and products in the reaction process and determining optimal deposition conditions.

A first objective of the present disclosure is to provide an absorption spectrum-based chemical vapor deposition online in-situ characterization system, which includes an absorption spectrum detection device, a spectrum movement and optical path calibration device, and a tubular CVD device; and the absorption spectrum detection device enables online in-situ characterization of the deposited sample.

Specifically, the absorption spectrum detection device includes a light source, a light source emitting module, a light source receiving module, and a spectrometer connected to the light source receiving module;

the spectrum movement and optical path calibration device includes two linear guide rails, and the light source emitting module and the light source receiving module are respectively mounted on the two linear guide rails; and the light source emitting module and the light source receiving module are moved along the linear guide rails to achieve online in-situ characterization of samples at any position in a quartz tube.

The tubular CVD device includes a furnace chamber, a quartz tube, and a quartz boat disposed inside the quartz tube for holding a deposited sample. In order to allow the light emitted from the light source emitting module to pass through the furnace chamber and achieve online in-situ characterization of samples at any position in a quartz tube, the furnace chamber is provided with two symmetrical optical access slots parallel to the quartz tube, the two optical access slots are symmetrically arranged with respect to an axial centerline of the quartz tube, and the two linear guide rails of the spectrum movement and optical path calibration device are respectively located at positions outside the furnace chamber corresponding to the two optical access slots, such that the light source emitting module and the light source receiving module can move linearly in an axial direction of the quartz tube to achieve online in-situ detection of samples at any position in the quartz tube; and the light emitted from the light source emitting module passes through the optical access slots, traverses the quartz tube and the deposited sample therein, and then reaches the light source receiving module, and the received light is then analyzed by the spectrometer to realize in-situ detection of the deposited sample; and a width of the optical access slot is set such that the light emitted from the light source emitting module and the light received by the light source receiving module can completely pass through.

Optionally, the spectrum movement and optical path calibration device further includes four stepper motors and is provided with a four-axis automatic optical calibration system. The four stepper motors are respectively recorded as a first horizontal stepper motor, a first vertical stepper motor, a second horizontal stepper motor, and a second vertical stepper motor; where the first horizontal stepper motor and the first vertical stepper motor achieve positioning of the light source emitting module in a horizontal plane by driving a ball screw and a guide rail mechanism, and the second horizontal stepper motor and the second vertical stepper motor are configured to control the rotation of the light source emitting module in horizontal and vertical planes, respectively.

Optionally, the four-axis optical path automatic calibration system uses a microcontroller or a programmable logic controller (PLC) to control the stepper motors. A rotation speed of each stepper motor can be controlled by setting its pulse-width modulation (PWM) wave. By comparing an intensity of the returned light, an optical path can be fine-tuned to maximize the intensity of the received light, thereby facilitating subsequent spectral analysis.

Optionally, the light source has a continuous emission spectrum covering a wavelength range of 200-1050 nm; and the light source offers strong collimation, with light spots focused within a circle with a diameter of 1 mm at a distance of 0.5 m.

A second objective of the present disclosure is to provide an absorption spectrum-based chemical vapor deposition online in-situ characterization method, which is implemented based on the aforesaid system and includes the following steps:

step 1: optical path calibration, aligning an optical path between the light source emitting module and the light source receiving module in the absorption spectrum detection device using the spectrum movement and optical path calibration device;

step 2) acquiring an absorption spectrum of a deposited sample during a deposition process using the absorption spectrum detection device; and step 3: performing in-situ detection of the deposited sample according to the acquired absorption spectrum.

Optionally, the step 2 includes:

step 2.1: acquiring red-light compensation spectra at different temperature intervals using the absorption spectrum detection device when no sample is placed in a tubular CVD device;

step 2.2: acquiring a real-time absorption spectrum during the deposition process; and step 2.3: subtracting the red-light compensation spectrum at the corresponding temperature from the real-time absorption spectrum to obtain a final spectrum of the deposited sample.

Optionally, the step 2.1 includes:

placing no sample to enable the optical path to pass through the quartz tube and the quartz boat to reach the light source receiving module under room temperature conditions, acquiring a spectrum and recording it as an initial spectrum;

gradually raising the temperature, taking a spectrum every $\Delta T$ starting from 100° C., and subtracting the initial spectrum to acquire the red-light compensation spectra under different temperature gradients.

Optionally, the step 1 includes: the bottom two motors, that is, the first horizontal stepper motor and the first vertical stepper motor define a position of the light source receiving module in a scanning manner, and the second horizontal stepper motor and the second vertical stepper motor perform fine adjustments in angle to maximize an incident light intensity.

A third objective of the present disclosure is to provide a method for determining a growth window of a deposited sample, which is implemented based on the aforesaid system and includes the following steps:

step S1: optical path calibration, aligning an optical path between the light source emitting module and the light source receiving module in the absorption spectrum detection device using the spectrum movement and optical path calibration device;

step S2: controlling the light source emitting module and the light source receiving module to move along the linear guide rails, and acquiring in real time absorption spectra of the deposited sample at different positions during the deposition process; and step S3: determining the growth window of the deposited sample according to the absorption spectra of the deposited sample at different positions during the deposition process. Optionally, the step S3 includes:

analyzing the material growth at different positions according to the absorption spectra of the deposited sample at different positions during the deposition process; and selecting a position where the material grows best as the growth window of the deposited sample.

The present disclosure has the beneficial effects:

By improving existing tubular CVD device and incorporating the proposed environmental compensation method, the present disclosure achieves accurate detection of the chemical vapor deposition process under high temperature and low pressure conditions. Furthermore, since the present disclosure can realize real-time detection, the law of changes in the sample or reaction system over time can be determined. Combined with changes in system temperature and pressure, the law of changes in the sample or reaction system with environmental changes such as temperature and pressure can be further acquired, thereby determining the optimal deposition conditions. In addition, through the automatic optical path calibration, the system can detect the deposition state of the sample at any position within the quartz tube during the chemical vapor deposition process, thereby quickly determining the accurate growth window of the sample.

BRIEF DESCRIPTION OF THE DRAWINGS

In order to more clearly illustrate the technical solution in the embodiments of the present disclosure, the accompanying drawings required to be used in the description of the embodiments are simply introduced below, and obviously, the accompanying drawings described below are only some embodiments of the present disclosure, such that for those of ordinary skill in the art, other drawings may further be derived from these drawings without making inventive efforts.

DETAILED DESCRIPTIONS OF THE EMBODIMENTS

In order to make the objects, technical solutions, and advantages of the present disclosure clearer, the embodiments of the present disclosure will be further described below in detail in conjunction with the accompanying drawings.

Embodiment 1

Figure 1:
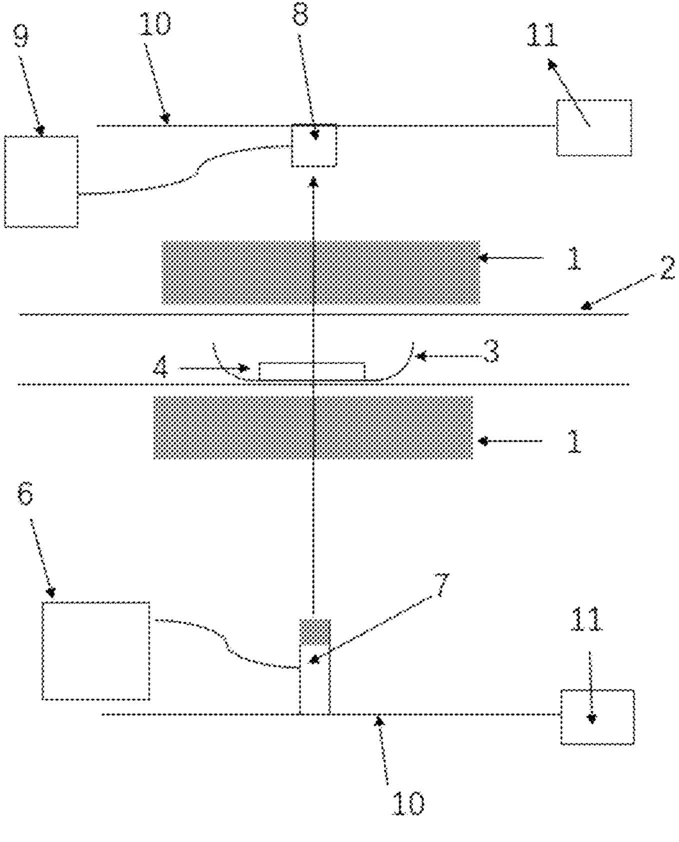
FIG. 1 is a schematic diagram of composition of an absorption spectrum-based chemical vapor deposition online in-situ characterization system according to the present disclosure.
Figure 2:
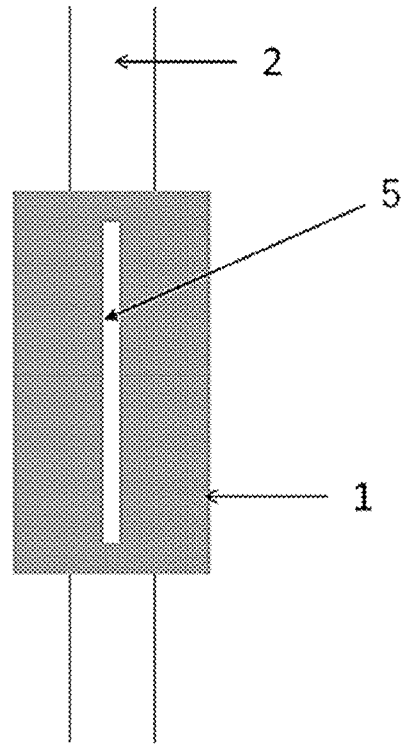
FIG. 2 is a top view of a furnace chamber of an absorption spectrum-based chemical vapor deposition online in-situ characterization system according to the present disclosure, and in the figure: 1. furnace chamber; 2. quartz tube; 3. quartz boat; 4. deposited sample; 5. optical access slot; 6. light source; 7. light source emitting module; 8. light source receiving module; 9. spectrometer; 10. linear guide rail; and 11. stepper motor.

This embodiment provides an absorption spectrum-based chemical vapor deposition online in-situ characterization system. As shown in FIG. 1, the absorption spectrum-based chemical vapor deposition online in-situ characterization system includes an absorption spectrum detection device, a spectrum movement and optical path calibration device, and a tubular CVD device; where the absorption spectrum detection device includes a light source 6, a light source emitting module 7, a light source receiving module 8, and a spectrometer 9 connected to the light source receiving module 8; the spectrum movement and optical path calibration device includes two linear guide rails 10 and corresponding stepper motors 11, and the light source emitting module 7 and the light source receiving module 8 are respectively mounted on the two linear guide rails 10; and the tubular CVD device includes a furnace chamber 1, a quartz tube 2, and a quartz boat 3 disposed inside the quartz tube 2 for holding a deposited sample 4; the furnace chamber 1 is provided with two symmetrical optical access slots 5 parallel to the quartz tube 2, as shown in FIG. 2, the two optical access slots 5 are symmetrically arranged with respect to an axial centerline of the quartz tube 2, and the two linear guide rails 10 of the spectrum movement and optical path calibration device are respectively located at positions outside the furnace chamber 1 corresponding to the two optical access slots 5, such that the light source emitting module 7 and the light source receiving module 8 can move linearly in an axial direction of the quartz tube 2; and light emitted from the light source emitting module 7 passes through the optical access slots 5, traverses the quartz tube 2 and the deposited sample 4 therein, and then reaches the light source receiving module 8, and the received light is then analyzed by the spectrometer 9 to realize in-situ detection of the deposited sample 4.

A length of the optical access slots 5 may be determined according to actual conditions, and a width thereof is set such that the light emitted from the light source emitting module 7 and the light received by the light source receiving module 8 can completely pass through.

It should be noted that, in addition to the furnace, the quartz tube, and the quartz boat disposed inside the quartz tube for holding the deposited sample, the tubular CVD device further includes other conventional structural components. The present disclosure makes no improvement in these components, so they are not described in detail herein.

Figure 3:
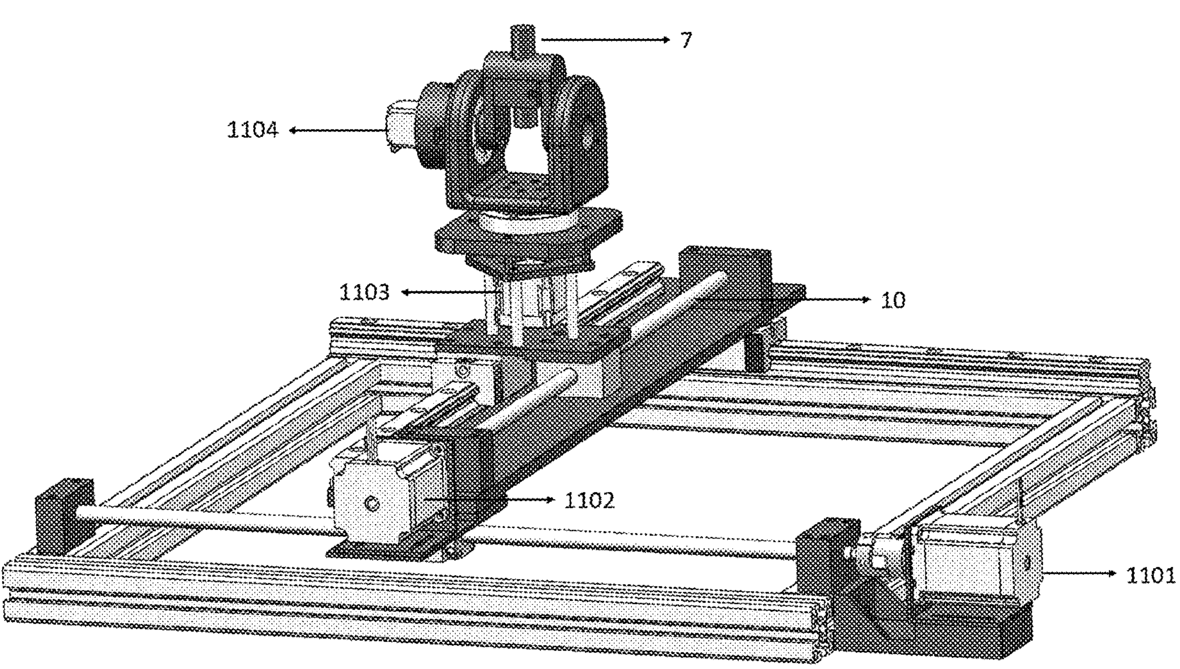
FIG. 3 is a perspective view of a four-axis optical path automatic calibration system.
Figure 4:
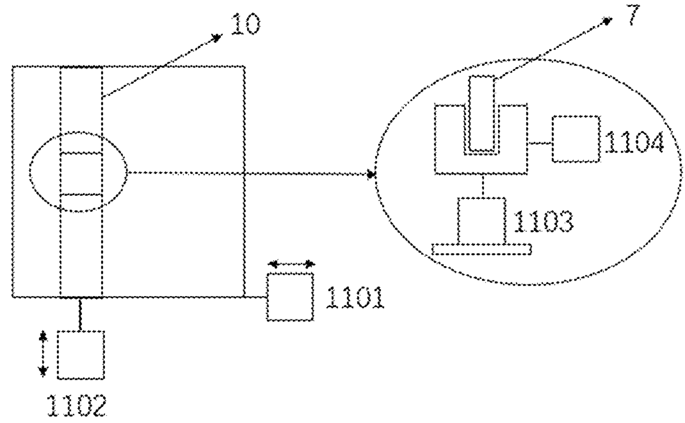
FIG. 4 is a schematic plan view of a four-axis optical path automatic calibration system, and in the figure: 1101. first horizontal stepper motor; 1102. first vertical stepper motor; 1103. second horizontal stepper motor; and 1104. second vertical stepper motor.

In order to ensure that the light emitted from the light source emitting module 7 can be precisely received by the light source receiving module 8, the present disclosure provides a four-axis optical path automatic calibration system, which achieves optical alignment between the light source emitting module 7 and the light source receiving module 8 by means of four stepper motors 11. Specifically, as shown in FIGS. 3 and 4, a first horizontal stepper motor 1101 and a first vertical stepper motor 1102 are used for coarse adjustment, while a second horizontal stepper motor 1104 and a second vertical stepper motor 1103 are used for fine adjustment. The first horizontal stepper motor 1101 and the first vertical stepper motor 1102 achieve positioning of the light source emitting module 7 in a horizontal plane by driving a ball screw and a guide rail mechanism, and the second horizontal stepper motor 1104 and the second vertical stepper motor 1103 are configured to control the rotation of the light source emitting module 7 in horizontal and vertical planes, respectively. The combination of the four stepper motors enables precise calibration of the light source. The four stepper motors are controlled by a microcontroller or a programmable logic controller (PLC). A rotation speed of each stepper motor can be controlled by setting its pulse-width modulation (PWM) wave. By comparing an intensity of the returned light, an optical path can be fine-tuned to maximize the intensity of the received light, thereby facilitating subsequent spectral analysis.

Figure 5:
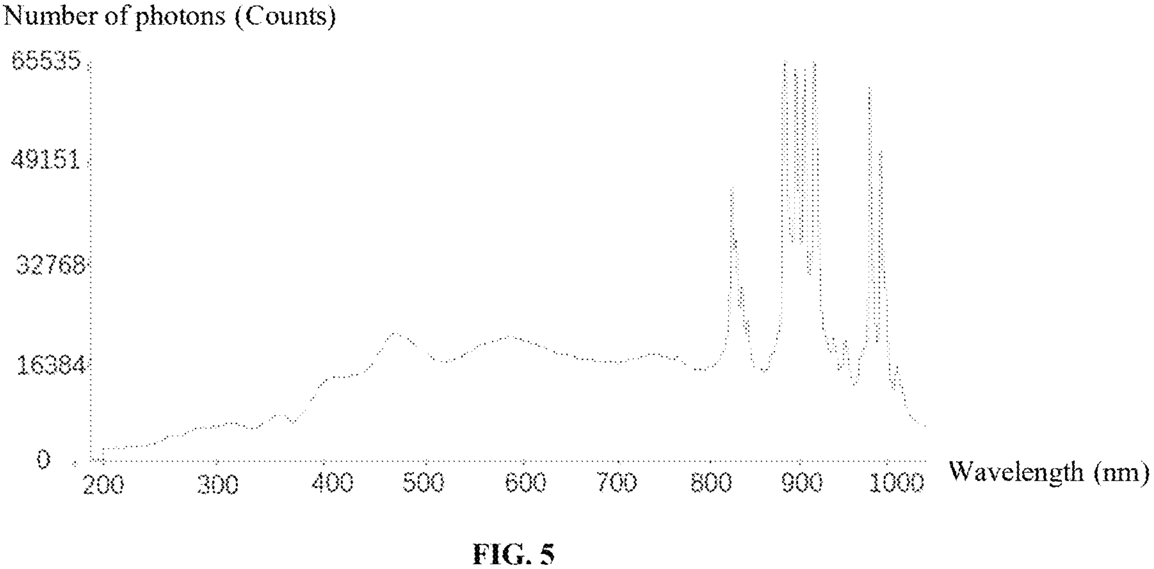
FIG. 5 is a spectrogram of a xenon lamp light source.

Considering the high-temperature and low-pressure environment inside the quartz tube during the chemical vapor deposition process (for example, the furnace chamber may glow red at high temperatures, which will have an impact on the optical signal), a selection process of the light source for the above absorption spectrum-based chemical vapor deposition online in-situ characterization system is as follows: a xenon lamp light source is initially selected as a white light source. The xenon lamp light source has the advantages of high brightness and a broad spectral range, with a wavelength range of 200-2500 nm, which can cover ultraviolet UV, visible, and infrared spectra. When the power is turned on, a 150 W high-pressure short-arc spherical xenon lamp installed inside a light source housing emits an arc discharge under high-frequency and high-pressure excitation. A luminous point of the xenon lamp is a very small point light source. Upon ignition the xenon lamp emits a strong and stable continuous spectrum, with a color in a visible region closely resembling sunlight. The emitted white light is transmitted to an outside via a fiber optic cable at a tail region. Through actual testing, it was found that a signal of the white light source in an ultraviolet band, especially in a range of 200-300 nm, was weak. The spectral signal is shown in FIG. 5. FIG. 5 shows a number of photons collected at various wavelengths; a higher number of collected photons, a greater the light intensity becomes.

Figure 6:
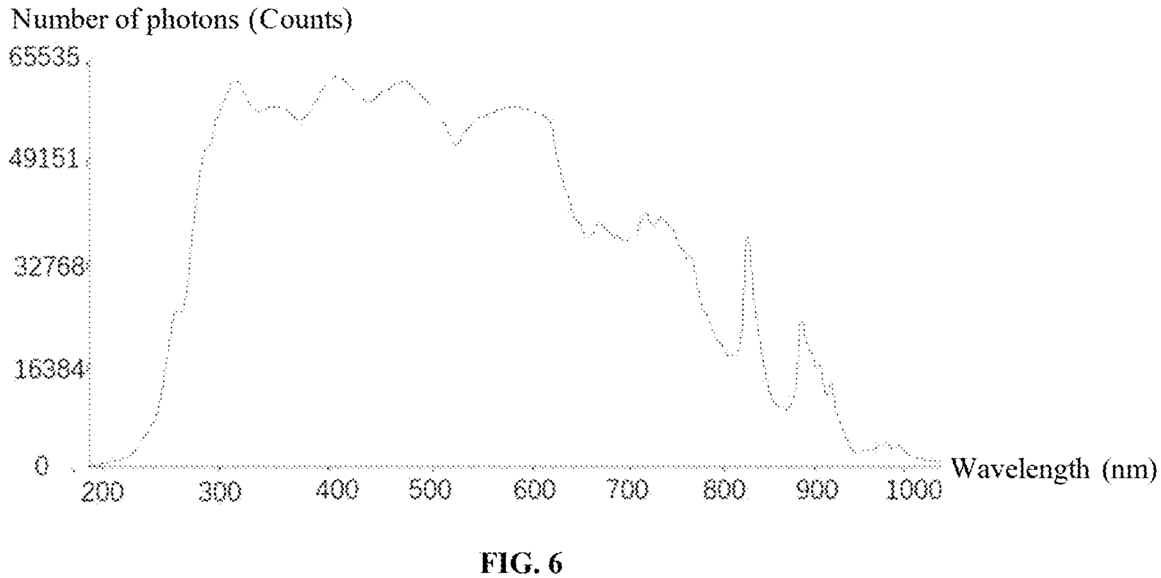
FIG. 6 is a spectrogram of an improved white light source used in the present disclosure.

However, since the ultraviolet band plays a critical role in the detection process, the present disclosure adopts a laser-induced white light source with a stronger signal in the ultraviolet band to meet experimental requirements. Compared with the xenon lamp light source, the laser-induced white light source offers the stronger signal, especially in the ultraviolet band. In order to further reduce signal loss in the ultraviolet band, a purge gas needs to be introduced around the light source; otherwise, oxygen in the atmosphere may generate ozone, which will weaken the light output in a wavelength range of 220-289 nm wavelength range. Nitrogen gas is selected as the purging gas, and is supplied from a steel cylinder. A pressure relief valve and a ball valve are installed sequentially in a gas inlet path, and the nitrogen gas can be finally delivered into the light source housing for purging through a 4 mm quick-connect tube. The spectral signal of the improved light source is shown in FIG. 6. Compared with FIG. 5, it can be seen that the improved spectral signal at 200-300 nm is enhanced.

The spectrometer 9 needs to meet a measurement wavelength range of 200-1050 nm, and the spectrometer can be a StellarNet Blue-Wave UVNb spectrometer. The wavelength measured by the spectrometer meets the range of 200-1050 nm. Moreover, the spectrometer has the advantages of compact size and fast response, and can quickly acquire a real-time spectrum when used in conjunction with the spectrum analysis software SpectraWiz. After receiving the incident white light, the light source receiving module 8 transmits the collected white light to the spectrometer through the optical fiber, and spectral information can be obtained after data analysis and processing. Alternatively, the spectrometer may include HORIBA iHR320, PG2000-pro, or FLEX+ UV-Vis-NIR, and other suitable models.

It should be noted that except for the laser-induced white light source mentioned above, other light sources that meet the following conditions may also be used by the absorption spectrum-based chemical vapor deposition online in-situ characterization system in the present disclosure:

1) emitting a continuous spectrum covering a wavelength range of 200-2000 nm;
2) providing strong enough overall light intensity, especially in an ultraviolet band of 200-400 nm; and
3) offering strong collimation, with light spots focused within a circle with a diameter of 1 mm at a distance of 0.5 m.

For example, xenon lamp light sources of EQ-99-FC-S LDLS, EQ-77X-QZ-S LDLS, and HPX-2000, as well as HGILX300 can also be used as the laser-induced white light sources.

Embodiment 2

Figure 7:
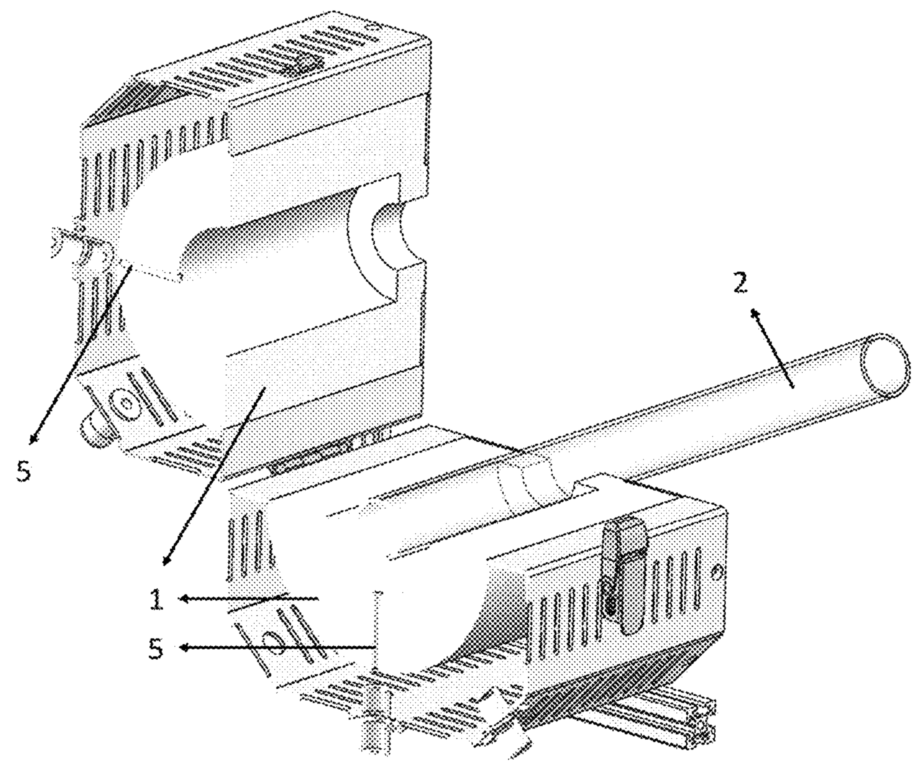
FIG. 7 is a schematic diagram showing a position of an optical access slot on a furnace in a tubular CVD device based on absorption spectrum provided by the present disclosure.

This embodiment provides an absorption spectrum-based chemical vapor deposition online in-situ characterization method. The method is implemented based on the absorption spectrum-based chemical vapor deposition online in-situ characterization system described in Embodiment 1. FIG. 7 illustrates a schematic diagram of a tube furnace with an optical access slot 5. The method includes the following steps:

Step 1: calibrating an optical path;

During a process of optical path calibration process, the bottom two motors, that is, the first horizontal stepper motor 1101 and the first vertical stepper motor 1102 locate a position of the light source receiving module 8 (that is, a spectrometer detector) in a scanning manner. Then, the upper two motors, that is, the second horizontal stepper motor 1104 and the second vertical stepper motor 1103, perform fine adjustments in angle to maximize an incident light intensity, thereby facilitating subsequent measurements.

The optical path calibration is implemented by an STM32 microcontroller. A rotational speed of each motor can be controlled by setting its PWM wave. By comparing the intensity of the light received by the spectrometer detector, the optical path can be fine-tuned to achieve maximal received light intensity.

Step 2: acquiring a temperature gradient compensation spectrum.

This step specifically includes the following sub-steps:

Step 2.1: placing no sample to enable the optical path to pass through the quartz tube and the quartz boat to reach the light source receiving module 8 (the spectrometer detector), acquiring a spectrum and recording it as an initial spectrum.

Step 2.2: gradually raising a temperature to 900° C., taking a spectrum every $\Delta T$ from 100° C., subtracting the initial spectrum to acquire red-light compensation spectra under different temperature gradients. A suitable value can be selected for AT according to actual situation, such as 5° C., 10° C., 25° C., or 50° C. Subsequently, a real-time spectrum acquired at a given temperature during the deposition process is subtracted by the corresponding red-light compensation spectrum to obtain a more accurate absorption spectrum, which is taken as a final spectrum.

When analyzing the material based on absorption spectrum, an absorbance of the material is calculated using the following formula:

$$\text{Absorbance}=\log_{10}(\text{Incident light intensity}/\text{Transmitted light intensity})$$

where the incident light intensity refers to an intensity of light emitted by the light source emitting module 7; and the transmitted light intensity refers to an intensity of light received by the light source receiving module 8.

For example:

Before the sample is placed, the light passes through the quartz boat and the quartz tube. No red-light emission occurs under room temperature conditions (25° C.), and the transmitted light intensity at this stage is recorded as L1;

After the sample is placed, the light passes through the quartz tube, the quartz boat, and the sample in the experimental conditions, red-light emission occurs at 800° C., and a transmitted light intensity at this stage is recorded as L2. Let a light intensity of the red-light compensation spectrum at 800° C. be L3, then an absorbance (measured value) without compensation is $A=\lg(L1/L2)$, and an actual value (true value) $A'=\lg(L1/(L2-L3))$. Therefore, a compensation value of the red-light compensation spectrum corresponding to 800° C. is $\Delta_{800}=A'-A=\lg(L2/(L2-L3))$.

The above method is used to obtain the compensation values $\Delta_{125}$, $\Delta_{150}$, $\Delta_{175}$, . . . and $\Delta_{1000}$ corresponding to the red-light compensation spectra at every 25° C. starting from 100° C.

During the subsequent deposition process, when the deposition temperature is set to 800° C., the obtained spectrum needs to subtract the red-light compensation spectrum 4800 corresponding to 800° C. to obtain a final spectrum, and analysis is performed according to the final spectrum.

Step 3: analyzing the deposition of the deposition process according to the final spectrum.

The deposition of the deposition process is analyzed through the spectrometer 9 according to the final spectrum, and is realized by applying known spectral analysis technology.

Since the light source emitting module 7 and the light source receiving module 8 are respectively mounted on the two linear guide rails 10, and an axial length of the optical access slot on the furnace chamber allows the light to reach any position inside the quartz tube 2, a sample at any position within the quartz tube 2 can be monitored in real time by the light source emitting module 7 and the light source receiving module 8 to obtain the deposition of the sample.

Existing in-situ technologies all involve in-situ characterization of a single-point position. In contrast, the present disclosure realizes position-variable in-situ characterization inside the quartz tube by synchronously moving the white-light source emitting module 7 and the light source receiving module 8 of the white light source. This innovation plays a significant role in exploring the growth window of new materials.

In many CVD processes, once the parameters such as temperature, pressure, and carrier gas flow rate are determined, a material growth will occur at given positions, which are usually referred to as growth windows. In conventional experimental processes, it is necessary to perform experiments repeatedly at different positions, followed by offline characterization. Several or even dozens of experiments are required to roughly determine the growth windows thereof, making the processes cumbersome and time-consuming. The system and method provided in the present disclosure enable flexible movement during the experiments, and the growth windows can be determined by characterizing the material growth conditions at different positions, making it possible to quickly obtain better deposition results.

Embodiment 3

This embodiment provides an absorption spectrum-based chemical vapor deposition online in-situ characterization method. The method is implemented based on the absorption spectrum-based chemical vapor deposition online in-situ characterization system described in Embodiment 1. The method is described in detail by taking a vertical single-walled carbon nanotube growth experiment as an example.

In traditional vertical single-walled carbon nanotube growth experiments, experimental results are determined by taking out the carbon nanotube samples after the experiments for observation using a scanning electron microscope (SEM), a transmission electron microscope (TEM), an atomic force microscope (AFM), and the like. In contrast, the absorption spectrum-based CVD online in-situ characterization provided in the present disclosure enables real-time observation.

In the experiment process, the system acquires the online absorption spectra in real time throughout the experiment.

Figure 8:
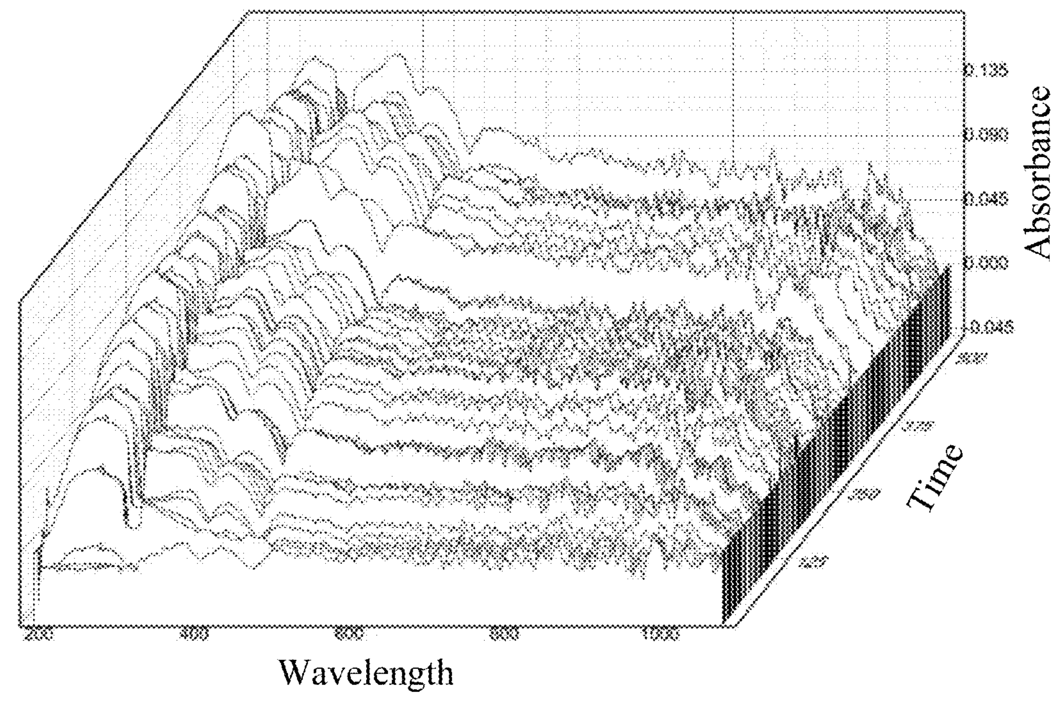
FIG. 8 shows an online absorption spectrum acquired during a low-growth-rate experiment using the absorption spectrum-based chemical vapor deposition online in-situ characterization provided in the present disclosure.
Figure 9:
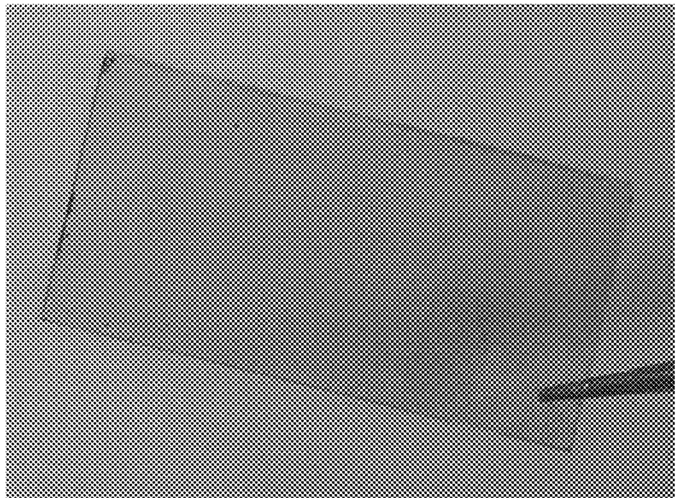
FIG. 9 is a photograph of a sample in a low-growth-rate experiment.

FIG. 8 shows an online absorption spectrum acquired during a low-growth-rate experiment (referred to as Experiment 1) using the absorption spectrum-based chemical vapor deposition online in-situ characterization provided in the present disclosure. It can be observed that a maximum absorbance is approximately 0.135, indicating that very few nanotubes were grown. FIG. 9 shows experimental results of a low-growth-rate experiment. It can be seen that a light gray material is visible on a surface of the substrate, confirming that only a small amount of single-walled carbon nanotubes were grown.

Figure 10:
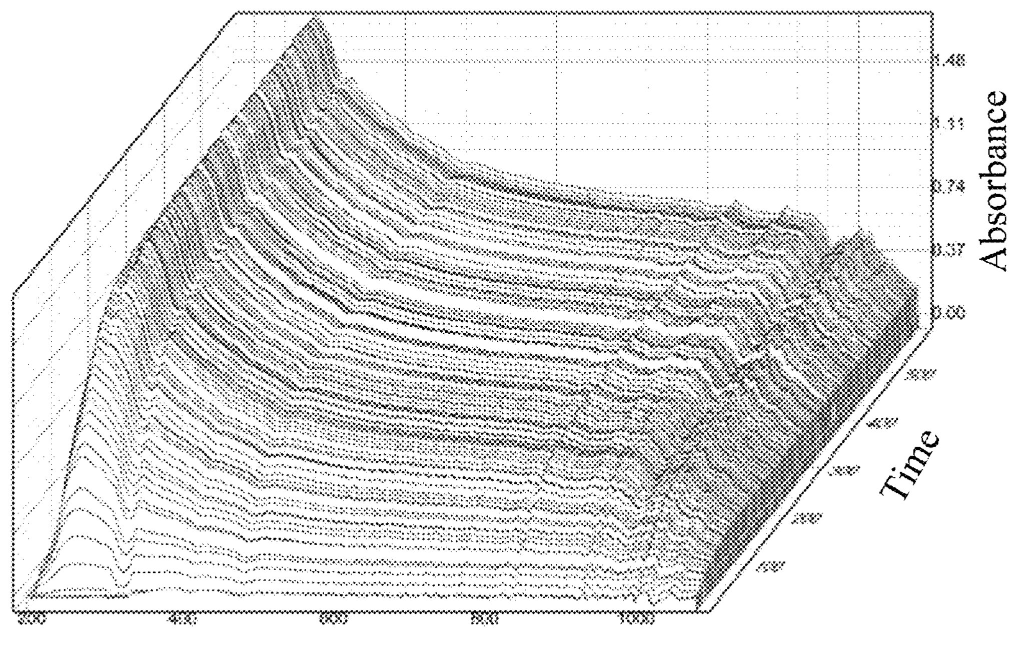
FIG. 10 shows an online absorption spectrum acquired during a high-growth-rate experiment using the absorption spectrum-based chemical vapor deposition online in-situ characterization provided in the present disclosure.
Figure 11:
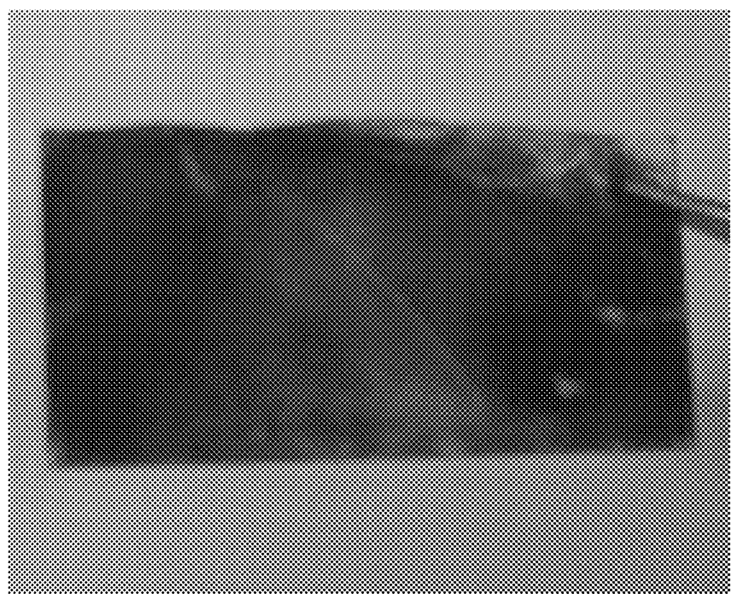
FIG. 11 is a photograph of a sample in a high-growth-rate experiment.
Figure 12:
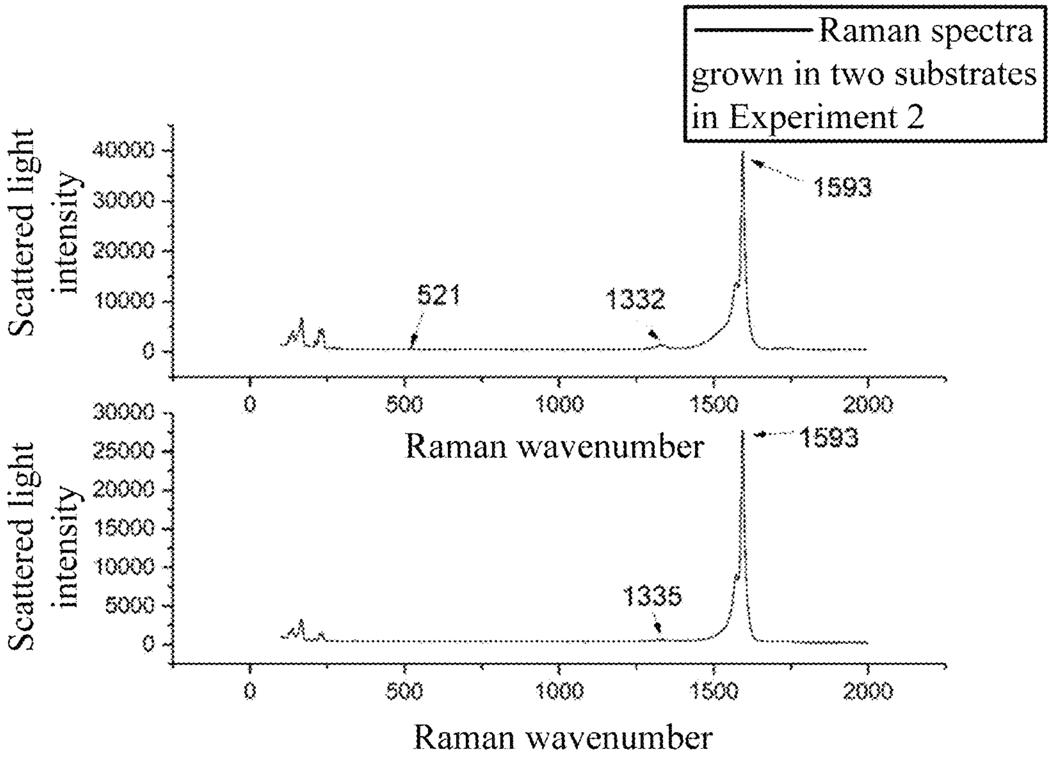
FIG. 12 is a Raman spectrogram of a high-growth-rate experiment.
Figure 13:
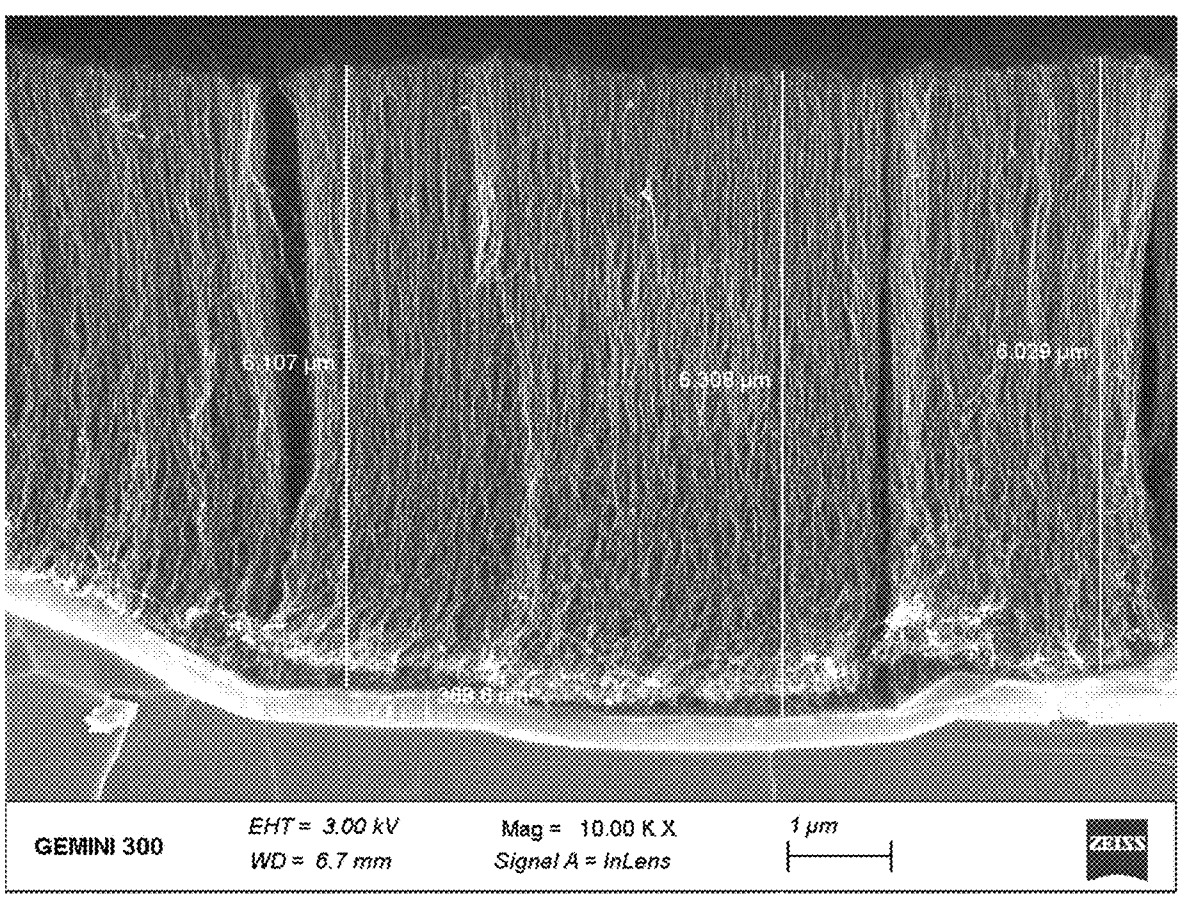
FIG. 13 is a scanning electron microscope (SME) image of a high-growth-rate experiment.

FIG. 10 shows an online absorption spectrum acquired during a high-growth-rate experiment (referred to as Experiment 2) using the absorption spectrum-based chemical vapor deposition online in-situ characterization provided in the present disclosure. It can be observed that a maximum absorbance is approximately 1.5, indicating that a significant amount of nanotubes was grown. FIG. 11 shows experimental results of a high-growth-rate experiment. It can be seen that a black material obviously appears on a surface of the substrate. Combined with a Raman spectrum (as shown in FIG. 12) and a SEM image (as shown in FIG. 13), it is confirmed that a large quantity of single-walled carbon nanotubes were grown on the substrate.

It should be noted when a position of the in-situ characterization needs to be changed, the motors controlling the spectrometer detector at the top and the motors at the corresponding directions at the bottom move a predefined distance at the same time, and the optical path is then automatically calibrated for further measurements.

As illustrated in FIGS. 8 and 10, the absorption spectrum-based chemical vapor deposition online in-situ characterization provided in the present disclosure can determine the law of changes in the sample or reaction system over time. When combined with changes in system parameters such as temperature and pressure over time, the law of changes in the sample or reaction system with environmental changes such as temperature and pressure can be further acquired.

Some of the steps in the embodiments of the present disclosure may be implemented using software, and the corresponding software programs can be stored on a readable storage medium, such as an optical disk or a hard disk.

What is described above is merely preferred embodiments of the present disclosure, and is not intended to limit the present disclosure. Any modifications, equivalent replacements and improvements, etc. made within the spirit and principle of the present disclosure should fall within the scope of protection of the present disclosure.

What is claimed is:

1. A system, comprising a spectrum movement and optical path calibration device, and a tubular chemical vapor deposition (CVD) device;

a light source; and a spectrometer;

wherein the spectrum movement and optical path calibration device comprises two linear guide rails;

wherein the light source and the spectrometer are respectively mounted on the two linear guide rails;

wherein the tubular CVD device comprises a furnace chamber, a quartz tube, and a quartz boat disposed within the quartz tube for holding a deposited sample;

wherein the furnace chamber comprises two optical access slots parallel to the quartz tube, the two optical access slots are symmetrically arranged with respect to an axial centerline of the quartz tube;

wherein the two linear guide rails are respectively located at positions outside the furnace chamber corresponding to the two optical access slots;

wherein light source and the spectrometer are configured to move linearly in an axial direction of the quartz tube and to detect samples at various positions in the quartz tube;

wherein the spectrometer is configured to analyze light emitted from the light source, through the optical access slots, the quartz tube and the deposited sample, and then incident on the spectrometer;

wherein the light source has a continuous emission spectrum covering a wavelength range of 200-1050 nm;

wherein the spectrometer is configured to analyze the light based on a difference between a red-light compensation spectrum acquired without any sample in the tubular CVD device and a real-time absorption spectrum acquired during a deposition process.

2. The system according to claim 1, wherein the spectrum movement and optical path calibration device further comprises a first horizontal stepper motor, a first vertical stepper motor, a second horizontal stepper motor, and a second vertical stepper motor; wherein the first horizontal stepper motor and the first vertical stepper motor are configured to position the light source in a horizontal plane, and the second horizontal stepper motor and the second vertical stepper motor are configured to control rotation of the light source.

3. A method of using the system of claim 1, comprising:

aligning an optical path between the light source and the spectrometer using the spectrum movement and optical path calibration device; and acquiring the red-light compensation spectrum and the real-time absorption spectrum.

4. A method of using the system of claim 1, comprising:

aligning an optical path between the light source and the spectrometer using the spectrum movement and optical path calibration device;

moving the light source and the spectrometer along the two linear guide rails, and acquiring absorption spectra of the deposited sample in real time at the various positions during the deposition process; and determining a growth window of the deposited sample according to the absorption spectra.

* * * * *